US008710522B2

(12) United States Patent
Li et al.

(10) Patent No.: US 8,710,522 B2
(45) Date of Patent: Apr. 29, 2014

(54) ORGANIC LIGHT EMITTING DIODE LIGHT SOURCE DEVICE

(71) Applicant: Industrial Technology Research Institute, Hsinchu Hsien (TW)

(72) Inventors: Jung-Yu Li, Hsinchu (TW); Yi-Ping Lin, Hsinchu (TW); Ming-Chung Liu, Hsinchu (TW); Li-Ling Lee, Hsinchu (TW)

(73) Assignee: Industrial Technology Research Institute, Chutung Township, Hsinchu County (TW)

( * ) Notice: Subject to any disclaimer, the term of this patent is extended or adjusted under 35 U.S.C. 154(b) by 0 days.

(21) Appl. No.: 13/707,127

(22) Filed: Dec. 6, 2012

(65) Prior Publication Data

US 2014/0070172 A1  Mar. 13, 2014

(30) Foreign Application Priority Data

Sep. 7, 2012  (TW) .............................. 101132671 A (51) Int. Cl.
*H01L 51/52* (2006.01)
*H01L 25/03* (2006.01)

(52) U.S. Cl.
USPC ..................................... 257/93; 257/E51.022

(58) Field of Classification Search
None
See application file for complete search history.

(56) References Cited

U.S. PATENT DOCUMENTS 6,870,196 B2   3/2005  Strip
7,999,463 B2 * 8/2011  Nomura ........................ 313/506
8,115,383 B2 * 2/2012  Cok et al. ....................... 313/506
8,148,725 B2 * 4/2012  Chen et al. ....................... 257/59
2002/0063533 A1 * 5/2002  Swallow ..................... 315/169.3
2002/0190661 A1 * 12/2002  Duggal et al. .............. 315/169.1
2003/0010985 A1 * 1/2003  Shen ............................... 257/79
2004/0032220 A1 * 2/2004  Cok et al. ....................... 315/291
2005/0174064 A1 * 8/2005  Agostinelli et al. ........ 315/169.3
2006/0125410 A1 * 6/2006  Duggal et al. .............. 315/169.3
2012/0286298 A1 * 11/2012  Pang et al. ....................... 257/88

FOREIGN PATENT DOCUMENTS

TW  200607382   2/2006
TW  200730004   8/2007

OTHER PUBLICATIONS

Cok, R., et. al. "60.3; AMOLED Displays using Transfer-Printged Integrated Circuits", 60.3 SID 10 Digest (2010), pp. 902-904.*
PhotonicRoadSME, R&D reprot on Organic Sumiconductors / OLEDs, (2009) downloaded from URL<http://www.photonicroad.eu/upload/PhotonicRoadSME_RD%020report%20on%20OLEDs.pdf> on Oct. 29, 2013.*

(Continued)

*Primary Examiner* — Thomas L Dickey
*Assistant Examiner* — Joseph Schoenholtz
(74) *Attorney, Agent, or Firm* — Muncy, Geissler, Olds & Lowe, P.C.

(57) ABSTRACT

An organic light emitting diode (OLED) light source device is provided, including a lower substrate, a plurality of OLED modules disposed on the lower substrate and arranged in a matrix, a bus circuit surrounding the OLED modules to form a mesh structure and connecting the OLED modules in parallel, and an upper substrate disposed on the OLED modules and the bus circuit. The bus circuit connects the OLED modules in parallel. Therefore, the OLED light source device can be arbitrarily cut into different shapes, and its service life and light emitting performance are not affected by the cutting.

23 Claims, 6 Drawing Sheets

(56) References Cited

OTHER PUBLICATIONS

Daniel, J. "Printed Electronics: Technologies, Challenges and Applications", International Workshop on Flexible and Printed Electronics (IWFPE 10), Sep. 8-10, 2010, Muju Resort, Korea.*

Bower, C.A., et. al. "Active Matrix OLED Display Backplanes using Transfer-Printed Microscale Integrated Circuits", IEEE Electronics Component and Technology Conference, (2010), pp. 1339-1343.*

"Cutting LCD Panel Power with LED Driver ICs", Davis, S.A.M.—Power Electronics Technology, Aug. 1, 2009, pp. 14-17, vol. 35.

"Mechanical Modeling of Flexible OLED Devices", Chang, Chien-Jung-Organic Electronics: Physics, materials, applications, Jul. 9, 2009, pp. 1268-1274, vol. 10

"Second Generation OLED Devices and Systems: Inline Evaporation, Highly Efficient OLED Devices, and Novel Driver/Controller ASICs",Joerg Amelung, Proceedings of SPIE—The International Society for Optical Engineering, 2005, pp. 596107-1-596107-11, vol. 5961

"Fabrication and Design of Various Dimensions of Multi-step Aspherical Microlens Arrays for OLED Package", PAN, Optics Communications, 2011, pp. 3323-3330, vol. 284, N. 13.

* cited by examiner

ORGANIC LIGHT EMITTING DIODE LIGHT SOURCE DEVICE

CROSS-REFERENCE TO RELATED APPLICATIONS

This application claimed priority to Taiwanese Patent Application No. 101132671, filed on Sep. 7, 2012.

BACKGROUND

1. Technical Field

The present disclosure relates to light source devices, and, more particularly, to an organic light emitting diode (OLED) light source device.

2. Description of Related Art

Organic light emitting diode (OLED) releases energy in the form of light through the electron-hole recombination process between the conduction band and the valence band. Therefore, a polymer organic thin film of semiconductor material properties can be used as the transport layers for electrons and holes and the light-emitting layer for electron-hole recombination. OLEDs are usually made from the thin-film process, while light emitting diodes (LEDs) require complicated epitaxial process to produce P- and N-type electron and hole transport layers. Accordingly, only rigid opaque substrates (e.g., gallium arsenide, silicon carbide (SiC) or sapphire) can be chosen as the substrate material of the LEDs. In addition to the generally opaque rigid substrates, the substrates of OLEDs can also be selected from transparent glass substrates, and even extended to flexible plastic substrates. In addition, the OLEDs are self-luminous, and therefore do not require a backlight module and a color filter. This can further reduce the thickness of the diode modules. In addition to being thin and flexible and with low glare, special characteristics such as high color rendering and full spectrum have made OLEDs the focus of attention for the next generation of lighting technology.

However, most of the OLED lighting devices have fixed specifications, such as fixed sizes and shapes. Light source devices with fixed specifications meet user's needs under certain circumstances, such as in certain corner regions of buildings or spaces with special shapes, or under circumstances in which flexible changes based on indoor spaces are needed. Therefore, the existing lighting equipment cannot provide enough flexibility in the product form factors, resulting in lighting design or application must accommodate the specifications of the existing lighting equipment.

SUMMARY

The present disclosure provides an organic light emitting diode (OLED) light source device, which includes: a lower substrate; a plurality of OLED modules disposed on the lower substrate and arranged in a matrix, each of the OLED modules including a first electrode layer disposed on the lower substrate, an OLED chip disposed on the first electrode layer, and a second electrode layer disposed on the OLED chip; a bus circuit surrounding the OLED modules to form a mesh structure and connecting the OLED modules in parallel, including a first bus line disposed on the lower substrate and electrically connected to the first electrode layers, an insulating layer disposed on the first bus line, and a second bus line disposed on the insulating layer and electrically connected to the second electrode layers; and an upper substrate disposed on the OLED modules and the bus circuit.

In an embodiment, each of the OLED modules includes a package frame structure such that the module has an independent package boundary, so that the service life of each OLED module is not affected after cutting.

The present disclosure also provides an OLED light source device, which includes: a lower substrate; a plurality of OLED modules disposed on the lower substrate and arranged in a matrix, each of the OLED modules including, a first electrode layer disposed on the lower substrate, a first color OLED chip disposed on the first electrode layer, a second electrode layer disposed on the first color OLED chip, a second color OLED chip disposed on the first electrode layer, a third electrode layer disposed on the second color OLED chip, a third color OLED chip disposed on the first electrode layer, and a fourth electrode layer disposed on the third color OLED chip; a bus circuit surrounding the OLED modules to form a mesh structure and connecting the OLED modules in parallel, including a first bus line disposed on the lower substrate and electrically connected to the first electrode layers, a first insulating layer disposed on the first bus line, a second bus line disposed on the first insulating layer and electrically connected to the second electrode layers, a second insulating layer disposed on the second bus line, a third bus line disposed on the second insulating layer and electrically connected to the third electrode layers, a third insulating layer disposed on the third bus line, a fourth bus line disposed on the third insulating layer and electrically connected to the fourth electrode layers; and an upper substrate disposed on the OLED modules and the bus circuit.

In an embodiment, each of the OLED modules includes a package frame structure such that the OLED module has an independent package boundary, so that the service life of each OLED module is not affected after cutting.

The present disclosure further provides an OLED light source device, which includes: a lower substrate; a plurality of OLED modules disposed on the lower substrate and arranged in a matrix, each of the OLED modules including a first electrode layer disposed on the lower substrate, an OLED chip disposed on the first electrode layer, and a second electrode layer disposed on the OLED chip; a bus circuit connecting the OLED modules in parallel, including a first planar electrode disposed on the lower substrate, a first insulating layer disposed on the first planar electrode, a first bus line disposed on the first insulating layer and electrically connected to the first electrode layers, and electrically connected to the first planar electrode through a first conductive via, a second insulating layer disposed on the first bus line, a second bus line disposed on the second insulating layer and electrically connected to the second electrode layers, a third insulating layer disposed on the second bus line, and a second planar electrode disposed on the third insulating layer and electrically connected with the second bus line through a second conductive via; and an upper substrate disposed on the OLED modules and the bus circuit.

In an embodiment, each of the OLED modules includes a package frame structure such that the OLED module has an independent package boundary, so that the service life of each OLED module is not affected after cutting.

BRIEF DESCRIPTION OF DRAWINGS

The present disclosure can be more fully understood by reading the following detailed description of the embodiments, with reference made to the accompanying drawings, wherein.

DETAILED DESCRIPTION

In the following detailed description, for purposes of explanation, numerous specific details are set forth in order to provide a through understanding of the disclosed embodiments. It will be apparent, however, that one or more embodiments may be practiced without these specific details. In other instances, well-known structures and devices are schematically shown in order to simplify the drawing.

Figure 1A:
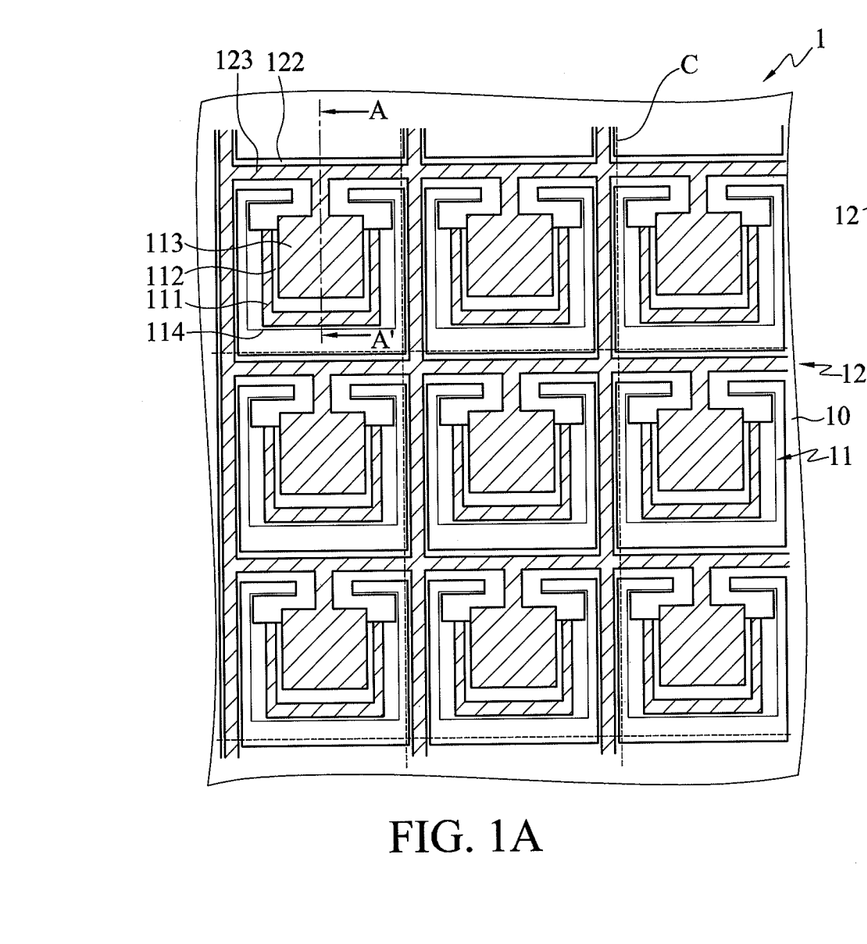
FIG. 1A is a schematic diagram depicting a top view of an organic light emitting diode (OLED) light source device in accordance with an embodiment of the present disclosure.
Figure 1B:
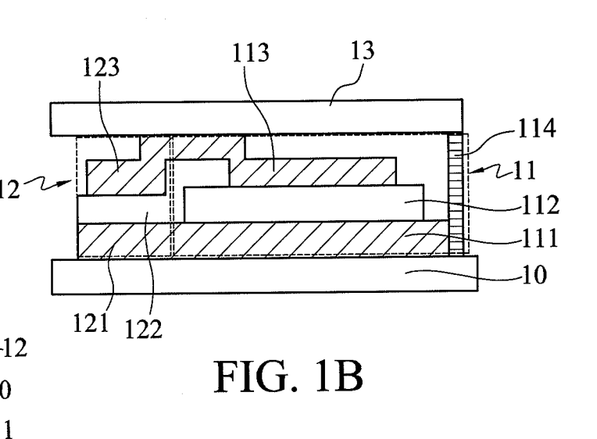
FIG. 1B is a cross-sectional schematic diagram along a line A-A' shown in FIG. 1A.

FIG. 1A is a schematic diagram depicting a top view of an organic light emitting diode (OLED) light source device 1 in accordance with a first embodiment of the present disclosure, and FIG. 1B is a cross-sectional schematic diagram of the OLED light source device 1 along a line A-A' shown in FIG. 1A. The OLED light source device 1 includes a lower substrate 10, a plurality of OLED modules 11, a bus circuit 12, and an upper substrate 13.

The OLED modules 11 are disposed on the lower substrate 10 and are arranged in a matrix. Each of the OLED modules 11 includes a first electrode layer 111 disposed on the lower substrate 10, an OLED chip 112 disposed on the first electrode layer 111, and a second electrode layer 113 disposed on the OLED chip 112.

Figure 4:
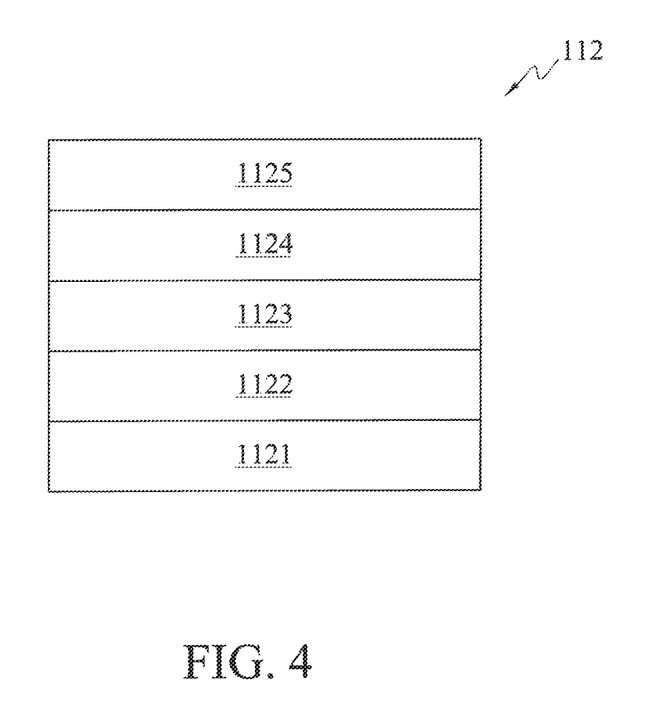
FIG. 4 is a cross-sectional view of the OLED chip shown in FIG. 1A.

In an embodiment, the OLED chip 112 comprises an electron injection layer 1121, an electron transport layer 1122, a light emitting layer 1123, a hole transport layer 1124, and a hole injection layer 1125 stacked on one another sequentially, as shown in FIG. 4.

The first electrode layer 111 can be used as the cathode for the OLED modules 11, and the second electrode layer 113 can be used as the anode for the OLED modules 11.

Each of the OLED modules 11 further includes a package frame structure 114 so that the OLED module 11 can have an independent package boundary. In an embodiment the package frame structure 114 is made of an UV-cured encapsulant or sealant. In an embodiment, the UV-cured encapsulant or sealant can further bond the lower substrate 10 and the upper substrate 13.

The bus circuit 12 surrounds the periphery of each of the OLED modules 11 to form a mesh structure. The bus circuit 12 connects the OLED modules 11 in parallel, and includes a first bus line 121, an insulating layer 122 and a second bus line 123.

The first bus line 121 is disposed on the lower substrate 10 and electrically connected to the first electrode layers 111, or at the same layer as the first electrode layers 111.

The insulating layer 122 is disposed on the first bus line 121 to avoid a short circuit to occur to the first bus line 121 and the second bus line 123.

The second bus line 123 is disposed on the insulating layer 122 and electrically connected to the second electrode layers 113, or at the same layer as the second electrode layers 113.

In an embodiment, the insulating layer 122 is made of silicon dioxide (SiO2).

In an embodiment, at least one of the upper substrate 13 and the lower substrate 10 is made of glass or plastic, and may have a water-repellent layer and a gas barrier layer, wherein the water-repellent layer and the gas barrier layer may be an aluminum oxide layer ($Al_2O_3$) deposited by Atomic Layer Deposition (ALD) method.

In an embodiment, the upper substrate 13, the lower substrate 10, or both may have cutting lines C thereon. The cutting lines C disposed on the upper substrate 13 and/or lower substrate 10 correspond in position to the peripheries of the OLED modules 11 used as the baseline when cutting.

Figure 1C:
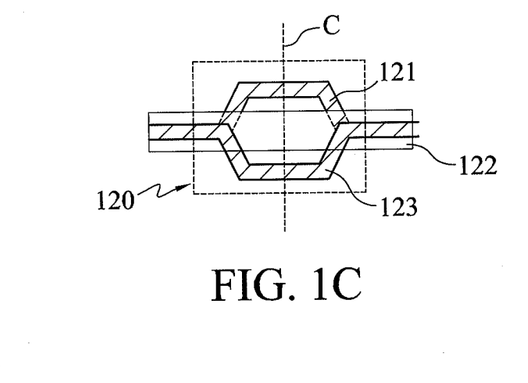
FIG. 1C is a schematic diagram depicting a top view of a wire contact structure in accordance with an embodiment of the present disclosure.

As shown in FIG. 1C, a wire contact structure 120 is disposed on a position of the bus circuit 12 corresponding to the cutting lines C that offsets the first bus line 121 and the second bus line 123. This facilitates connections to external power supply.

Figure 1D:
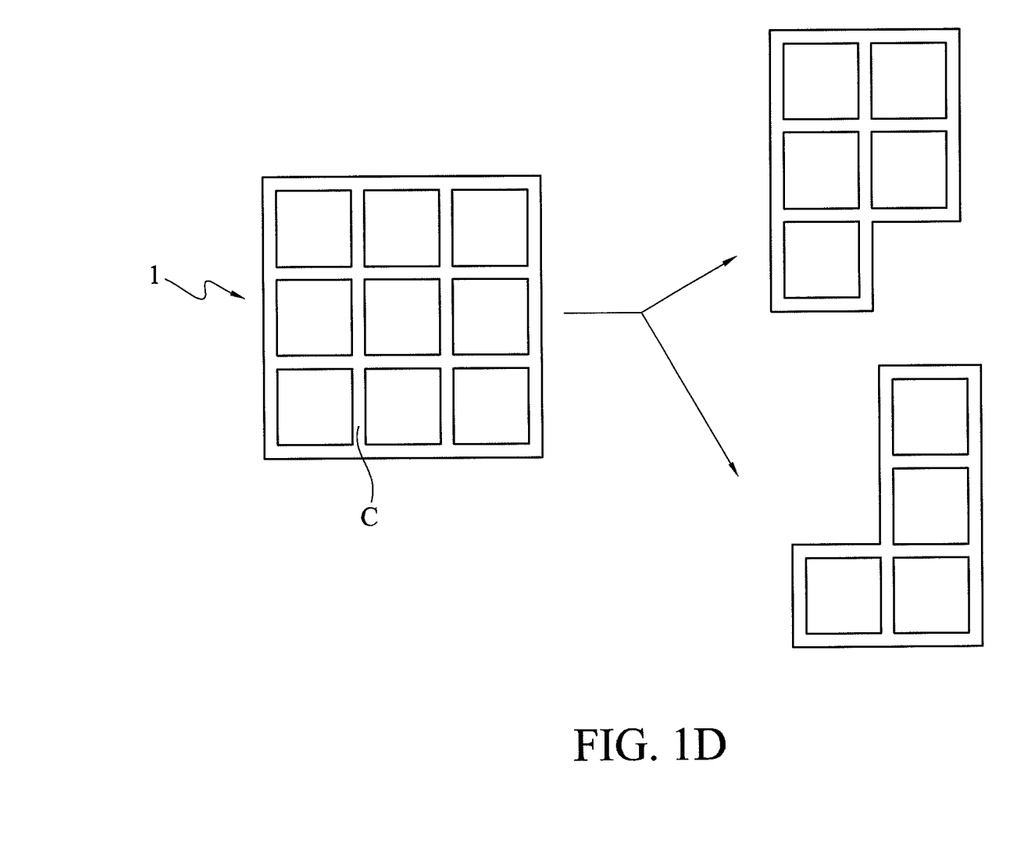
FIG. 1D is a schematic diagram illustrating cutting of the OLED light source device of the present disclosure.

As shown in FIG. 1D, the OLED light source device 1 can be arbitrary cut along the cutting lines C.

Figure 1E:
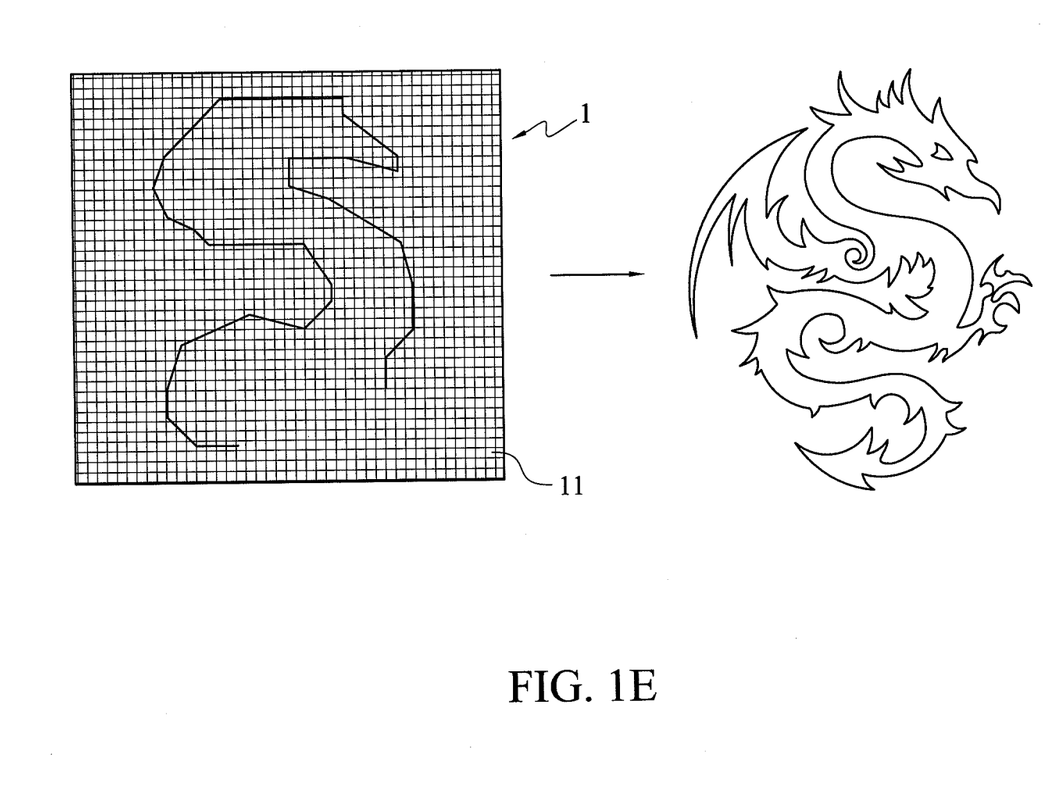
FIG. 1E is a schematic diagram illustrating cutting of the OLED light source device of the present disclosure.

As shown in FIG. 1E, if a finer pattern is to be cut out, each of the OLED modules 11 has to be miniaturized to have a smaller area. With this, the tolerance of cutting error also becomes narrower, such that at the time of cutting, some of the OLED modules 11 may be inevitably damaged at the cutting borders. However, the size of the OLED modules 11 has been reduced to an extent that damage to some of the OLED modules 11 is not noticeable to human eyes, and therefore has no impact on the overall light emitting effect and appearance.

In addition, in an example of the OLED light source device 1 of the present disclosure, the OLED modules 11 are connected in parallel. Therefore, after arbitrary cutting, the voltage required by the light source device after cutting and that required by the OLED modules are the same, while the amount of power (watts) required after cutting is proportional to the number of modules in the light source device. For example, each of the OLED modules 11 requires a power of 1 watt, and the light source device after cutting contains ten OLED modules 11, then a power supply needs to provide 10 watts to the light source device after cutting.

Figure 2A:
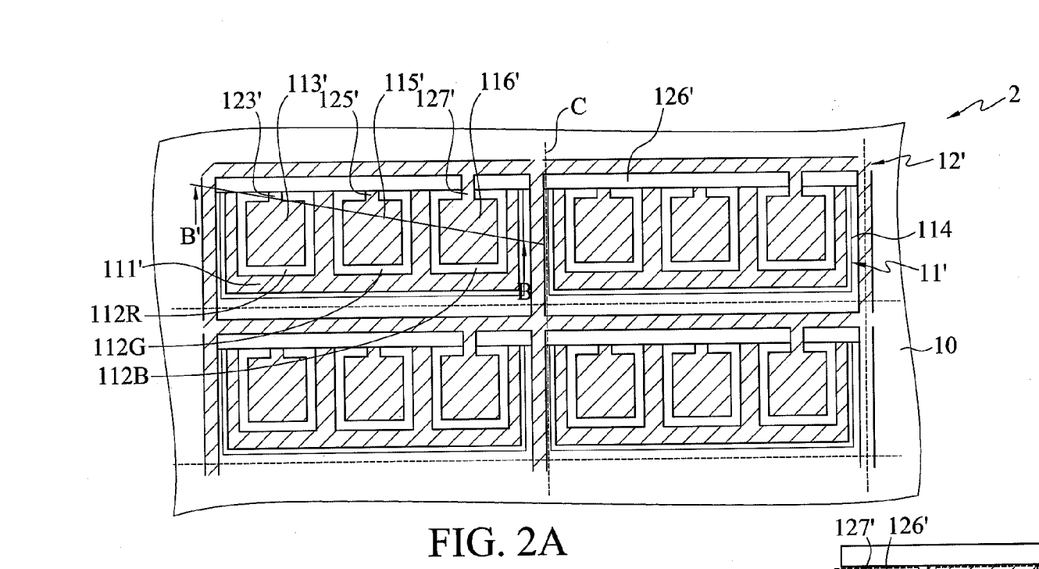
FIG. 2A is a schematic diagram depicting a top view of an organic light emitting diode light source device in accordance with another embodiment of the present disclosure.
Figure 2B:
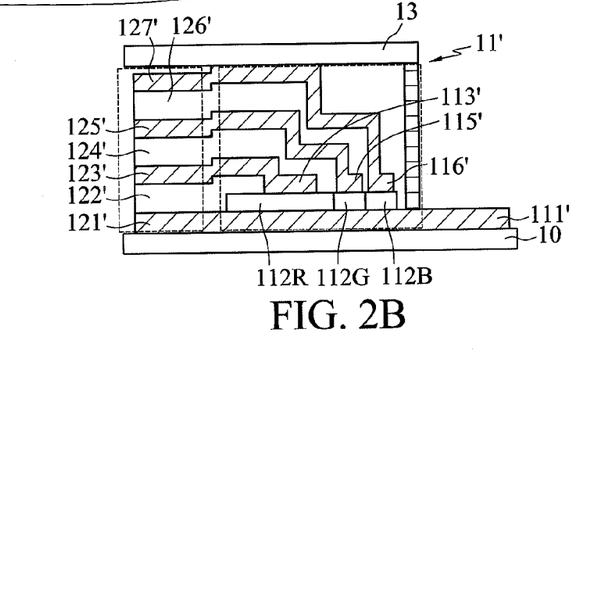
FIG. 2B is a cross-sectional schematic diagram along a line B-B' shown in FIG. 2A.

FIG. 2A is a schematic diagram depicting a top view of an OLED light source device 2 in accordance with a second embodiment of the present disclosure, and FIG. 2B is a cross-sectional schematic diagram of the OLED light source device 2 along a line B-B' shown in FIG. 2A. The OLED light source device 2 includes the lower substrate 10, a plurality of OLED modules 11', a bus circuit 12', and the upper substrate 13. The second embodiment differs from the first embodiment in that each of the OLED modules 11' includes a first electrode layer 111', a first color OLED chip 112R, a second color OLED chip 112G, and a third color OLED chip 112B, and the bus circuit 12' includes a first bus line 121', a first insulating layer 122', a second bus line 123', a second insulating layer 124', a third bus line 125', a third insulating layer 126', and a fourth bus line 127'.

The first electrode layer 111' is disposed on the lower substrate 10. The first color OLED chip 112R is disposed on the first electrode layer 111'. The second electrode layer 113' is disposed on the first color OLED chip 112R. The second color OLED chip 112G is disposed on the first electrode layer 111'. The third electrode layer 115' is disposed on the second color OLED chip 112G. The third color OLED chip 112B is disposed on the first electrode layer 111'. The fourth electrode layer 116' is disposed on the third color OLED chip 112B.

In an embodiment, the first color OLED chip, the second color OLED chip, and the third color OLED chip are red, green, and blue OLED chips, respectively.

The first bus line 121' is disposed on the lower substrate 10 and electrically connected to the first electrode layers 111', or at the same layer as the first electrode layers 111'. The first insulating layer 122' is disposed on the first bus line 121'.

The second bus line 123' is disposed on the first insulating layer 122' and electrically connected to the second electrode layers 113', or at the same layer as the second electrode layers 113'. The second insulating layer 124' is disposed on the second bus line 123'.

The third bus line 125' is disposed on the second insulating layer 124' and electrically connected to the third electrode layers 115', or at the same layer as the third electrode layers 115'. The third insulating layer 126' is disposed on the third bus line 125'.

The fourth bus line 127' is disposed on the third insulating layer 126' and electrically connected to the fourth electrode layers 116', or at the same layer as the fourth electrode layers 116'.

In an embodiment, the OLED module 11' can emit three colors of light: red light, blue light, and green light, and the intensities of the lights can be individually controlled so that the light emitting module exhibit different shades and color temperatures, wherein the red, green, and blue OLED chips are each disposed by sequentially stacking an electron injection layer, an electron transport layer, a light emitting layer, a hole transport layer and a hole injection layer together. The electron injection layer of the red OLED chip is joined with the first electrode layer 111', and the hole injection layer is joined with the second electrode layer 113'. The electron injection layer of the green OLED chip is joined with the first electrode layer 111', and the hole injection layer is joined with the third electrode layer 115'. The electron injection layer of the blue OLED chip is joined with the first electrode layer 111', and the hole injection layer is joined with the fourth electrode layer 116'.

Figure 2C:
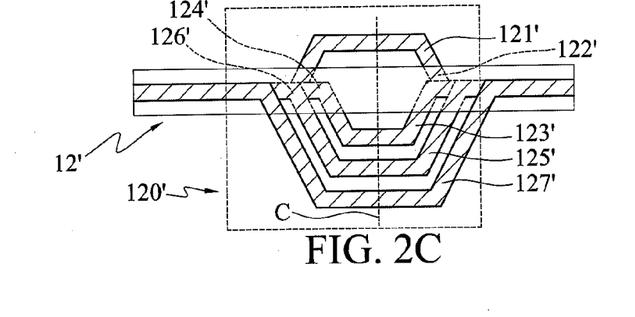
FIG. 2C is a schematic diagram depicting a top view of a wire contact structure in accordance with another embodiment of the present disclosure.

As shown in FIG. 2C, a wire contact structure 120' is disposed at a portion of the bus circuit 12' corresponding to the cutting lines C that offsets the first bus line 121', the second bus lines 123', the third bus lines 125', and the fourth bus lines 127'. This facilitates connections to external power supply.

Figures 3A, 3B:
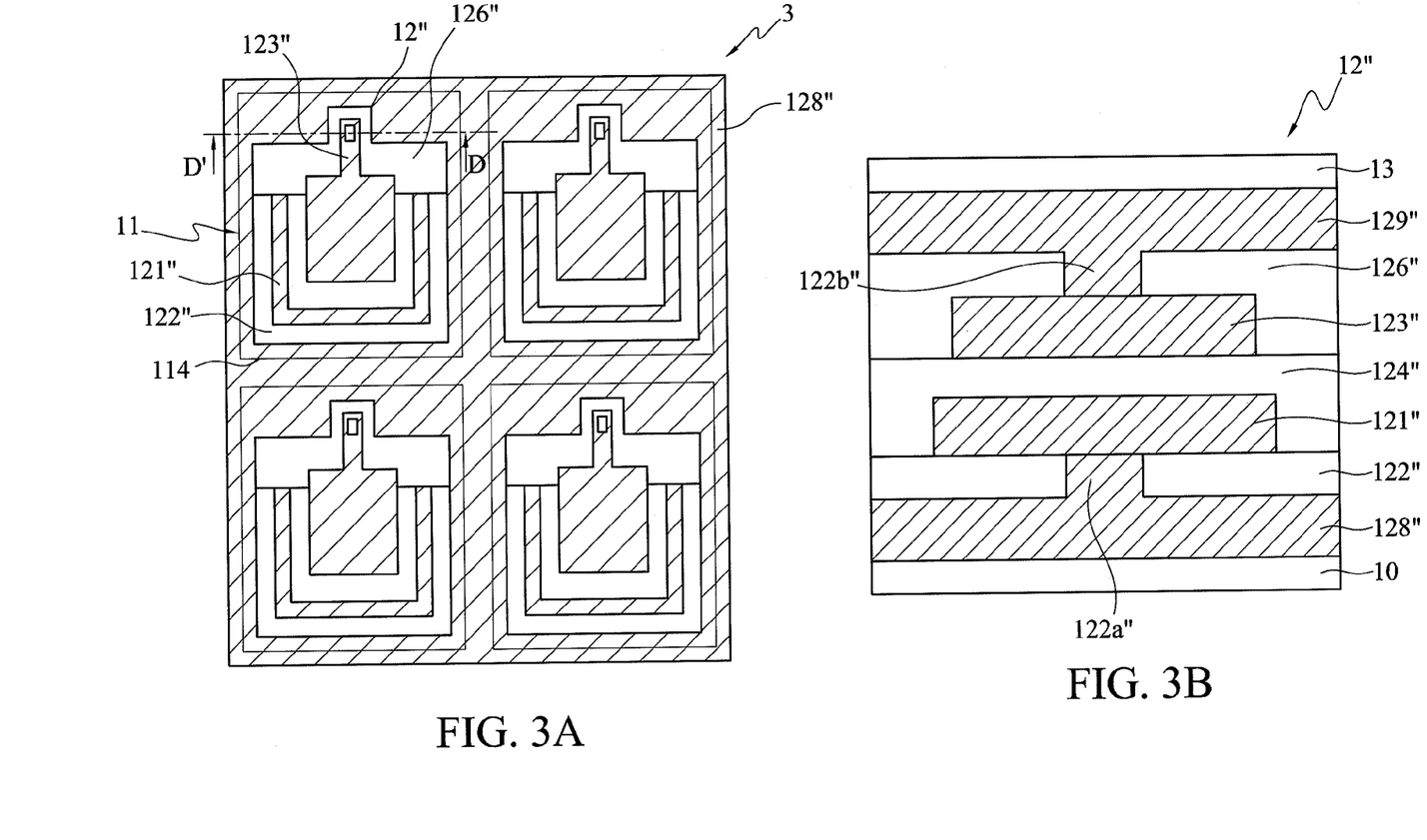
FIG. 3A is a schematic diagram depicting a top view of an organic light emitting diode light source device in accordance with yet another embodiment of the present disclosure.
FIG. 3B is a cross-sectional schematic diagram along a line D-D' shown in FIG. 3A.

FIG. 3A is a schematic diagram depicting a top view of an OLED light source device in accordance with a third embodiment of the present disclosure, and FIG. 3B is a cross-sectional schematic diagram of the OLED light source device 3 along a line D-D' shown in FIG. 2A. The OLED light source device 3 includes the lower substrate 10, the plurality of OLED modules 11, a bus circuit 12", and the upper substrate 13. The third embodiment differs from the first embodiment in that the bus circuit 12" includes a first planar electrode 128", a first insulating layer 122", a first bus line 121", a second insulating layer 124", a second bus line 123", a third insulating layer 126", and a second planar electrode 129".

The first planar electrode 128" is disposed on the lower substrate 10, and the first insulating layer 122" is disposed on the first planar electrode 128".

The first bus line 121" is disposed on the first insulating layer 122" and electrically connected to the first electrode layers 111, and electrically connected to the first planar electrode 128" through a first conductive via 122a".

The second insulating layer 124" is disposed on the first bus line 121", and the second bus line 123" is disposed on the second insulating layer 124" and electrically connected to the second electrode layers 113.

The third insulating layer 126" is disposed on the second bus line 123", and the second planar electrode 129" is disposed on the third insulating layer 126" and electrically connected to the second bus line 123" through a second conductive via 122b".

In summary, the OLED light source device of the present disclosure utilizes the design of a bus circuit to enable the OLED light source device to be arbitrarily cut into shapes, while preventing the OLED modules from damage due to the ingress of moisture, thereby significantly improving the designs and application range of the OLED light source device.

What is claimed is:

1. An organic light emitting diode (OLED) light source device, comprising:
 a lower substrate;
 a plurality of OLED modules disposed on the lower substrate and arranged in a matrix, each of the OLED modules including:
 a first electrode layer formed on the lower substrate;
 an OLED chip formed on the first electrode layer; and
 a second electrode layer formed on the OLED chip;
 a bus circuit surrounding the OLED modules to form a mesh structure and connecting the OLED modules in parallel, including:
 a first bus line disposed on the lower substrate and electrically connected to the first electrode layers;
 an insulating layer disposed on the first bus line; and
 a second bus line disposed on the insulating layer and electrically connected to the second electrode layers; and
 an upper substrate disposed on the OLED modules and the bus circuit.

2. The OLED light source device of claim 1, wherein each of the OLED modules includes a package frame structure such that the OLED module has an independent package boundary.

3. The OLED light source device of claim 2, wherein the package frame structure is made of an UV-cured encapsulant or sealant.

4. The OLED light source device of claim 1, wherein at least one of the upper substrate and the lower substrate is made of glass or plastic.

5. The OLED light source device of claim 1, wherein the first bus line comprises the first electrode layer, and the second bus line comprises the second electrode layer.

6. The OLED light source device of claim 1, further comprising cutting lines formed on at least one of the upper substrate and the lower substrate and corresponding in position to peripheries of the OLED modules.

7. The OLED light source device of claim 6, further comprising a wire contact structure disposed on a portion of the bus circuit corresponding to the cutting lines that offsets the first bus line and the second bus line.

8. The OLED light source device of claim 1, wherein the OLED chip comprises an electron injection layer, an electron transport layer, a light emitting layer, a hole transport layer, and a hole injection layer stacked on one another sequentially, wherein the electron injection layer is joined with the first electrode layer, and the hole injection layer is joined with the second electrode layer.

9. An OLED light source device, comprising:
a lower substrate;
a plurality of OLED modules disposed on the lower substrate and arranged in a matrix, each of the OLED modules including:
a first electrode layer formed on the lower substrate;
a first color OLED chip disposed on the first electrode layer;
a second electrode layer formed on the first color OLED chip;
a second color OLED chip disposed on the first electrode layer;
a third electrode layer formed on the second color OLED chip;
a third color OLED chip disposed on the first electrode layer; and
a fourth electrode layer formed on the third color OLED chip;
a bus circuit surrounding the OLED modules to form a mesh structure and connecting the OLED modules in parallel, including:
a first bus line formed on the lower substrate and electrically connected to the first electrode layer;
a first insulating layer formed on the first bus line;
a second bus line formed on the first insulating layer and electrically connected to the second electrode layer;
a second insulating layer formed on the second bus line;
a third bus line formed on the second insulating layer and electrically connected to the third electrode layer;
a third insulating layer formed on the third bus line;
a fourth bus line formed on the third insulating layer and electrically connected to the fourth electrode layer; and
an upper substrate disposed on the OLED modules and the bus circuit.

10. The OLED light source device of claim 9, wherein the first color OLED chip is a red OLED chip, the second color OLED chip is a blue OLED chip, and the third color OLED chip is a green OLED chip.

11. The OLED light source device of claim 9, wherein the first bus line comprises the first electrode layer, the second bus line comprises the second electrode layer, the third bus line comprises the third electrode layer, and the fourth bus line comprises the fourth electrode layer.

12. The OLED light source device of claim 9, wherein each of the OLED modules includes a package frame structure such that the OLED module has an independent package boundary.

13. The OLED light source device of claim 12, wherein the package frame structure is made of an UV-cured encapsulant or sealant.

14. The OLED light source device of claim 9, wherein at least one of the upper substrate and the lower substrate is made of glass or plastic.

15. The OLED light source device of claim 9, further comprising cutting lines disposed on at least one of the upper substrate and the lower substrate and corresponding in position to peripheries of the OLED modules.

16. The OLED light source device of claim 15, further comprising a wire contact structure disposed on a portion of the bus circuit corresponding to the cutting lines that offsets the first bus line, the second bus line, the third bus line, and the fourth bus line.

17. The OLED light source device of claim 9, wherein at least one of the first color OLED chip, the second color OLED chip and the third color OLED chip comprises an electron injection layer, an electron transport layer, a light emitting layer, a hole transport layer and a hole injection layer stacked on one another sequentially, wherein the electron injection layers of the first color OLED chip, the second color OLED chip and the third color OLED chip are joined with the first electrode layer, and the hole injection layers of the first color OLED chip, the second color OLED chip and the third color OLED chip are joined with the second electrode layer, the third electrode layer, and the fourth electrode layer, respectively.

18. An OLED light source device, comprising:
a lower substrate;
a plurality of OLED modules disposed on the lower substrate and arranged in a matrix, each of the OLED modules including:
a first electrode layer disposed on the lower substrate;
an OLED chip disposed on the first electrode layer; and
a second electrode layer formed on the OLED chip;
a bus circuit connecting the OLED modules in parallel, including:
a first planar electrode formed on the lower substrate;
a first insulating layer formed on the first planar electrode;
a first bus line formed on the first insulating layer and electrically connected to the first electrode layer, and electrically connected to the first planar electrode through a first conductive via;
a second insulating layer formed on the first bus line;
a second bus line formed on the second insulating layer and electrically connected to the second electrode layer;
a third insulating layer formed on the second bus line; and
a second planar electrode formed on the third insulating layer and electrically connected with the second bus line through a second conductive via; and
an upper substrate disposed on the OLED modules and the bus circuit.

19. The OLED light source device of claim 18, wherein each of the OLED modules includes a package frame structure such that the OLED module has an independent package boundary.

20. The OLED light source device of claim 19, wherein the package frame structure is made of an UV-cured encapsulant or sealant.

21. The OLED light source device of claim 18, wherein at least one of the upper substrate and the lower substrate is made of glass or plastic.

22. The OLED light source device of claim 18, further comprising cutting lines disposed on at least one of the upper substrate and the lower substrate and corresponding in position to peripheries of the OLED modules.

23. The OLED light source device of claim 18, wherein at least one of the OLED chip comprises an electron injection layer, an electron transport layer, a light emitting layer, a hole transport layer and a hole injection layer stacked on one another sequentially, wherein the electron injection layer is joined with the first electrode layer, and the hole injection layer is joined with the second electrode layer.

* * * * *